(12) United States Patent
Choi et al.

(10) Patent No.: US 12,648,465 B2
(45) Date of Patent: Jun. 2, 2026

(54) EMBEDDED TRACE SUBSTRATES (ETSS) WITH T-SHAPED INTERCONNECTS WITH REDUCED-WIDTH EMBEDDED METAL TRACES, AND RELATED INTEGRATED CIRCUIT (IC) PACKAGES AND FABRICATION METHODS

(71) Applicant: QUALCOMM Incorporated, San Diego, CA (US)

(72) Inventors: Seongryul Choi, Seongnam (KR); Joan Rey Villarba Buot, Escondido, CA (US); Kuiwon Kang, San Diego, CA (US); Zhijie Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 505 days.

(21) Appl. No.: 18/158,225

(22) Filed: Jan. 23, 2023

(65) Prior Publication Data

US 2024/0250009 A1     Jul. 25, 2024

(51) Int. Cl.
H10W 70/65        (2026.01)
H10P 14/46        (2026.01)
(Continued)

(52) U.S. Cl.
CPC ............. H10W 70/65 (2026.01); H10P 14/46 (2026.01); H10W 20/074 (2026.01);
(Continued)

(58) Field of Classification Search
None
See application file for complete search history.

(56) References Cited

U.S. PATENT DOCUMENTS 9,137,900 B2 *   9/2015  Tanaka ................... H05K 1/185
9,572,256 B2 *   2/2017  Yoshikawa ............ H05K 1/111
(Continued)

OTHER PUBLICATIONS

International Search Report and Written Opinion for International Patent Application No. PCT/US2024/010808, mailed May 8, 2024, 12 pages.

*Primary Examiner* — Cory W Eskridge
(74) *Attorney, Agent, or Firm* — Withrow & Terranova, PLLC

(57)        ABSTRACT

Embedded trace substrates (ETS) having an ETS metallization layer with T-shaped interconnects with reduced-width embedded metal traces, and related integrated circuit (IC) packages and fabrication methods. The ETS includes an outer ETS metallization layer that includes T-shaped interconnects for supporting input/output (I/O) connections between the ETS and another opposing package substrate. To increase density of I/O interconnections, the pitch of the embedded metal traces in the ETS metallization layer is reduced. The T-shaped interconnects also each include an additional metal contact pad that is coupled to a respective embedded metal trace to increase the height of the embedded metal trace to eliminate a vertical connection gap between the ETS and an opposing package substrate. In the T-shape interconnects, their embedded metal traces are reduced in width in a horizontal direction(s) as compared to their respective metal contact pads to provide room for additional metal traces for additional signal routing capacity.

20 Claims, 9 Drawing Sheets

(51) Int. Cl.

| | |
|---|---|
| *H10W 20/00* | (2026.01) |
| *H10W 90/00* | (2026.01) |
| *H10W 72/00* | (2026.01) |
| *H10W 72/20* | (2026.01) |
| *H10W 72/29* | (2026.01) |
| *H10W 72/90* | (2026.01) |
| *H10W 80/00* | (2026.01) |

(52) U.S. Cl.
CPC ...  *H10W 72/07254* (2026.01); *H10W 90/701* (2026.01); *H10W 72/07252* (2026.01); *H10W 72/07554* (2026.01); *H10W 72/221* (2026.01); *H10W 72/242* (2026.01); *H10W 72/29* (2026.01); *H10W 72/9415* (2026.01); *H10W 80/743* (2026.01); *H10W 90/724* (2026.01); *H10W 90/754* (2026.01); *H10W 90/794* (2026.01)

(56) References Cited

U.S. PATENT DOCUMENTS

| | | | | |
|---|---|---|---|---|
| 2015/0208517 A1* | 7/2015 | Lee | ........................ | H05K 3/007 |
| | | | | 174/251 |
| 2016/0307847 A1* | 10/2016 | Lee | ................... | H01L 23/49827 |
| 2017/0263545 A1 | 9/2017 | Tsukamoto et al. | | |
| 2020/0388573 A1* | 12/2020 | Kang | ............... | H01L 23/49805 |
| 2022/0310488 A1* | 9/2022 | Fang | .................... | H10W 20/40 |
| 2022/0352110 A1* | 11/2022 | Yim | .................... | H10W 90/401 |
| 2023/0114404 A1* | 4/2023 | Choi | .................... | H10W 70/05 |
| | | | | 257/690 |
| 2023/0230908 A1* | 7/2023 | Buot | .................... | H10W 90/00 |
| | | | | 257/107 |

* cited by examiner

400 —

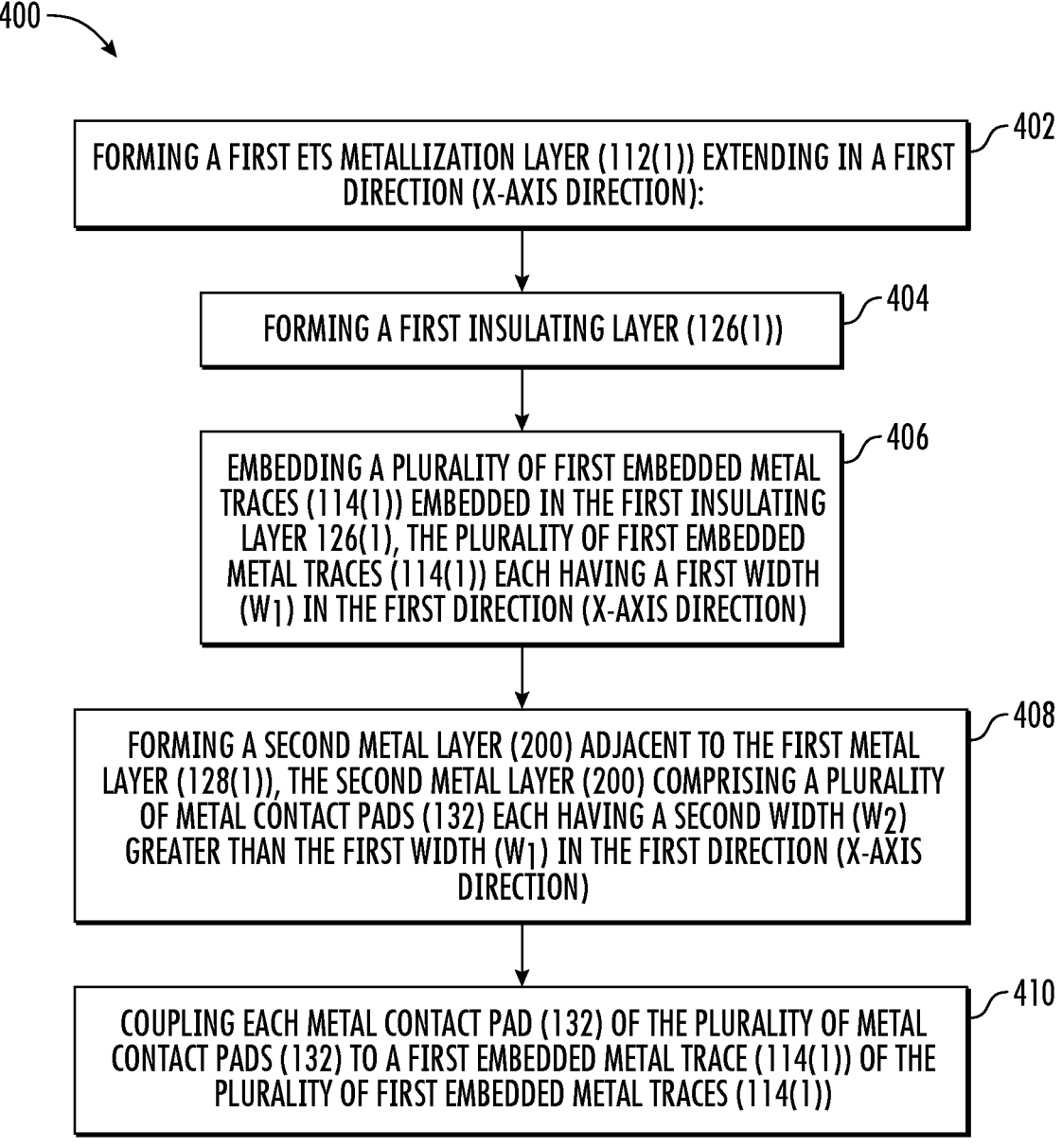

FORMING A FIRST ETS METALLIZATION LAYER (112(1)) EXTENDING IN A FIRST DIRECTION (X-AXIS DIRECTION): ⌐402

FORMING A FIRST INSULATING LAYER (126(1)) ⌐404

EMBEDDING A PLURALITY OF FIRST EMBEDDED METAL TRACES (114(1)) EMBEDDED IN THE FIRST INSULATING LAYER 126(1), THE PLURALITY OF FIRST EMBEDDED METAL TRACES (114(1)) EACH HAVING A FIRST WIDTH ($W_1$) IN THE FIRST DIRECTION (X-AXIS DIRECTION) ⌐406

FORMING A SECOND METAL LAYER (200) ADJACENT TO THE FIRST METAL LAYER (128(1)), THE SECOND METAL LAYER (200) COMPRISING A PLURALITY OF METAL CONTACT PADS (132) EACH HAVING A SECOND WIDTH ($W_2$) GREATER THAN THE FIRST WIDTH ($W_1$) IN THE FIRST DIRECTION (X-AXIS DIRECTION) ⌐408

COUPLING EACH METAL CONTACT PAD (132) OF THE PLURALITY OF METAL CONTACT PADS (132) TO A FIRST EMBEDDED METAL TRACE (114(1)) OF THE PLURALITY OF FIRST EMBEDDED METAL TRACES (114(1)) ⌐410

FIG. 4

FROM FIG. 5A

506

FORM INSULATING LAYERS (204, 604) TO INSULATE ADDITIONAL METAL CONTACT PADS (132) AND METAL INTERCONNECTS (114(3))

508

PATTERN OPENINGS (606, 608) IN INSULATING LAYERS (204, 604) TO EXPOSE ADDITIONAL METAL CONTACT PADS (132) AND METAL INTERCONNECTS (114(3))

FROM FIG. 5B

510

COUPLE THE INTERPOSER SUBSTRATE (102) TO THE ETS (106) BY COUPLING THE VERTICAL INTERCONNECTS (122) TO THE EXPOSED ADDITIONAL METAL CONTACT PADS (132) OF THE T-SHAPED INTERCONNECTS (130)

500

1

EMBEDDED TRACE SUBSTRATES (ETSS) WITH T-SHAPED INTERCONNECTS WITH REDUCED-WIDTH EMBEDDED METAL TRACES, AND RELATED INTEGRATED CIRCUIT (IC) PACKAGES AND FABRICATION METHODS

BACKGROUND

I. Field of the Disclosure

The field of the disclosure relates to integrated circuit (IC) packages, and more particularly to design and fabrication of package substrates that support signal routing to a semiconductor die(s) in the IC package.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that are mounted on and electrically coupled to a package substrate to provide physical support and an electrical interface to the die(s). The package substrate includes one or more metallization layers that include metal interconnects (e.g., metal traces, metal lines) with vias coupling the metal interconnects together between adjacent metallization layers to provide electrical interfaces between the die(s). The die(s) is electrically interfaced to metal interconnects exposed in a top or outer metallization layer of the package substrate to electrically couple the die(s) to the metal interconnects of the package substrate. For example, the package substrate may include an embedded trace substrate (ETS) layer adjacent to the die to facilitate higher density bump/solder joints for coupling the die(s) to the package substrate. Metal interconnects in the outer metallization layer are coupled to other metal interconnects in other, lower metallization layers in the package substrate to provide signal routing paths to a coupled die. For example, a package substrate may be a three-layer (3L) ETS package substrate with three (3) metallization layers stacked in a vertical direction.

Some IC packages are known as "hybrid" IC packages, which include multiple die packages with respective dies for different purposes or applications. For example, a hybrid IC package may be an application die, such as a communications modem or processor (including a system). The hybrid IC package could also include, for example, one or more memory dies to provide memory to support data storage and access by the application die. Multiple dies could be disposed in a single die layer and disposed adjacent to each other in a horizontal direction on a package substrate in the IC package. The multiple dies could also be provided in their own respective die packages that are stacked on top of each other in a package-on-package (POP). In a POP IC package, an upper die package that includes an upper die coupled to a package substrate, can be coupled to a lower die package that includes a lower die coupled to another package substrate. An interposer substrate can be disposed between the upper and lower die packages to support providing electrical connections between the stacked die packages. The interposer substrate may be electrically coupled to vertical metal interconnections (e.g., copper balls) that are in the lower die package adjacent to its die to provide electrical connection from the upper die package through the interposer substrate through the lower die package and to package substrate of the lower die package. The pitch of these vertical metal interconnections affect the density or number of interconnections that can be made between the upper die package and the lower die package.

SUMMARY OF THE DISCLOSURE

Aspects disclosed herein embedded trace substrates (ETS) with T-shaped interconnects with reduced-width embedded metal traces. Related integrated circuit (IC) packages and fabrication methods are also disclosed. For example, the reduced width embedded metal traces of the T-shaped interconnects provide more space in the ETS metallization layer between adjacent embedded metal traces for additional metal traces to be added for additional signal routing capacity. In an exemplary aspect, the ETS includes an outer ETS metallization layer that is elongated in a first, horizontal direction(s) and that includes T-shaped interconnects for supporting input/output (I/O) connections between the ETS and another opposing package substrate, such as an interposer substrate in a package-on-package (POP) IC package. The T-shaped interconnects each include an embedded metal trace embedded in an insulating layer that is then coupled to other metal interconnects in the ETS to provide signal routing. To increase the density of I/O interconnections to the ETS, the pitch of these embedded metal traces in the ETS metallization layer can be reduced. However, reducing the pitch of the embedded metal traces can then also require that vertical interconnects (e.g., metal balls) used to connect these embedded metal traces in the ETS metallization layer to metal interconnects of another opposing package substrate in a second, vertical direction orthogonal to the first direction be reduced in size as well (e.g., to avoid shorts between adjacent vertical interconnects). Thus, these reduced size vertical interconnects can result in vertical connection gaps between the ETS and an opposing package substrate. Thus, to avoid these vertical connections gaps, in exemplary aspects, the T-shaped interconnects also each include an additional metal contact pad that is coupled to or disposed on a respective embedded metal trace to increase the height of the embedded metal trace, thus allowing smaller sized vertical interconnects to connect the T-shaped interconnects to metal interconnects in an opposing package substrate. In further exemplary aspects, the T-shape interconnects get their T-shape by the embedded metal traces being reduced in width in a horizontal direction(s) as compared to their respective additional coupled metal contact pads. This is so that the additional metal contact pads still have a sufficient landing area to support connections to the vertical interconnects, but the reduced-width embedded metal traces allow more space between adjacent embedded metal traces in the ETS metallization layer. This provides additional space to form additional metal traces in the ETS metallization layer between adjacent embedded metal traces of the T-shaped interconnects to provide additional signal routing capacity in the ETS metallization layer even with reduced pitch I/O connections.

In this regard, in one exemplary aspect, an ETS is provided. The ETS comprises a first ETS metallization layer extending in a first direction. The first ETS metallization layer comprises a first insulating layer and a first metal layer. The first metal layer comprises a plurality of first embedded metal traces embedded in the first insulating layer, the plurality of first embedded metal traces each having a first width in the first direction. The first ETS metallization layer also comprises a second metal layer adjacent to the first metal layer, the second metal layer comprising a plurality of metal contact pads each having a second width greater than the first width in the first direction. Each metal contact pad of the plurality of metal contact pads is coupled to a first embedded metal trace of the plurality of first embedded metal traces.

In another exemplary aspect, a method of fabricating an ETS is provided. The method includes forming a first ETS metallization layer extending in a first direction, comprising forming a first insulating layer, and embedding a plurality of first embedded metal traces in a first metal layer in the first insulating layer, the plurality of first embedded metal traces each having a first width in the first direction. The method also comprises forming a second metal layer adjacent to the first metal layer, the second metal layer comprising a plurality of metal contact pads each having a second width greater than the first width in the first direction. The method also comprises coupling each metal contact pad of the plurality of metal contact pads to a first embedded metal trace of the plurality of first embedded metal traces.

In another exemplary aspect, an IC package is provided. The IC package comprises a first die package. The first die package comprises ETS comprising a first ETS metallization layer extending in a first direction. The first die is coupled to the first ETS metallization layer. The first ETS metallization layer comprises a first insulating layer, and a first metal layer. The first metal layer comprises a plurality of first embedded metal traces embedded in the first insulating layer, the plurality of first embedded metal traces each having a first width in the first direction. The ETS further comprises a second metal layer adjacent to the first metal layer, the second metal layer comprising a plurality of metal contact pads each having a second width greater than the first width in the first direction. Each metal contact pad of the plurality of metal contact pads is coupled to a first embedded metal trace of the plurality of first embedded metal traces. The IC package also comprises an interposer substrate comprising a plurality of first metal interconnects. The IC package also comprises a plurality of vertical interconnects extending in a second direction orthogonal to the first direction, each vertical interconnect of the plurality of vertical interconnects coupled to a metal contact pad of the plurality of metal contact pads and a first metal interconnect of the plurality of first metal interconnects.

BRIEF DESCRIPTION OF THE FIGURES

FIG. 4 is a flowchart illustrating an exemplary fabrication process of fabricating an ETS that includes an outer ETS metallization layer that includes T-shape interconnects with reduced width embedded metal traces each coupled to a larger width additional metal contact pad coupled to vertical interconnects coupled to the opposite interposer substrate, including but not limited to the ETSs in FIGS. 1 and 2;

DETAILED DESCRIPTION

Figure 1:
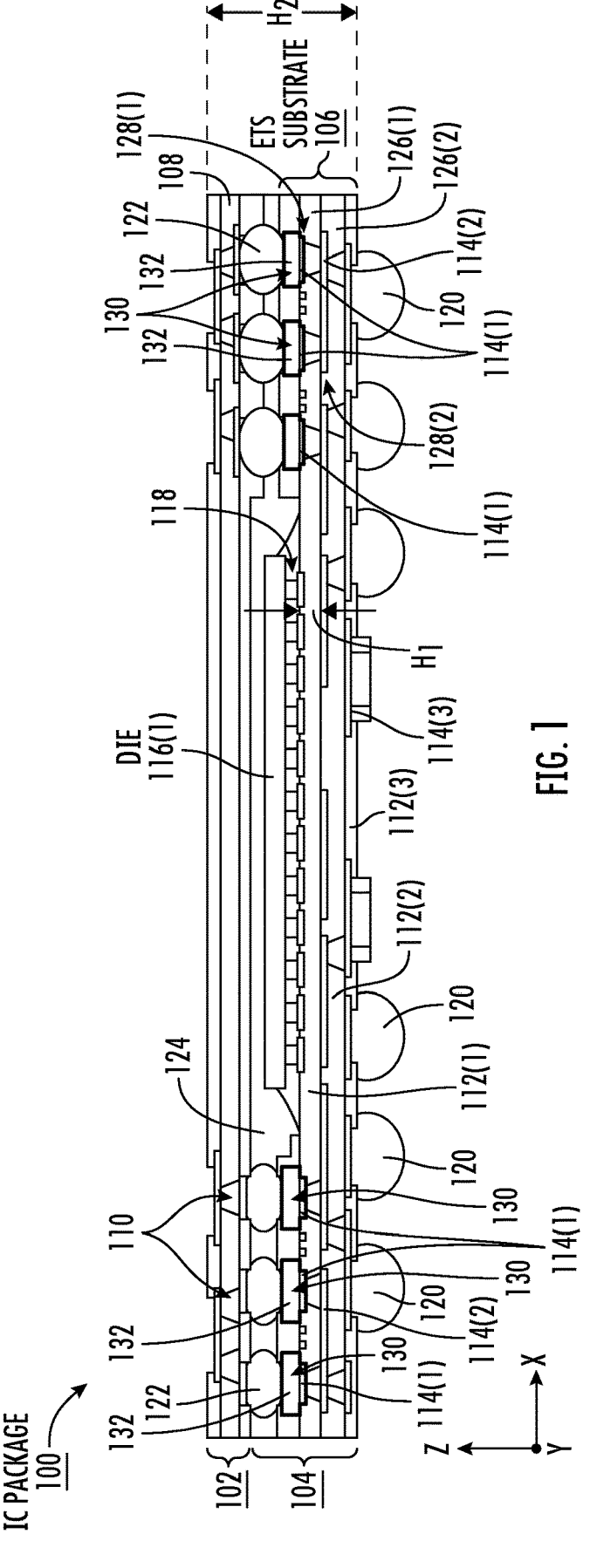
FIG. 1 is a side view of an integrated circuit (IC) package that includes an interposer substrate coupled to a lower die package that includes a die coupled to an embedded trace substrate (ETS), wherein the ETS includes an outer ETS metallization layer that includes T-shape interconnects with reduced width embedded metal traces each coupled to a larger width additional metal contact pad coupled to vertical interconnects coupled to the opposite interposer substrate, to provide electrical connections between the interposer substrate and the ETS with additional space between the embedded metal traces available to provide additional signal routing capacity in the ETS.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein embedded trace substrates (ETS) with T-shaped interconnects with reduced-width embedded metal traces. Related integrated circuit (IC) packages and fabrication methods are also disclosed. For example, the reduced width embedded metal traces of the T-shaped interconnects provide more space in the ETS metallization layer between adjacent embedded metal traces for additional metal traces to be added for additional signal routing capacity. In an exemplary aspect, the ETS includes an outer ETS metallization layer that is elongated in a first, horizontal direction(s) and that includes T-shaped interconnects for supporting input/output (I/O) connections between the ETS and another opposing package substrate, such as an interposer substrate in a package-on-package (POP) IC package. The T-shaped interconnects each include an embedded metal trace embedded in an insulating layer that is then coupled to other metal interconnects in the ETS to provide signal routing. To increase the density of I/O interconnections to the ETS, the pitch of these embedded metal traces in the ETS metallization layer can be reduced. However, reducing the pitch of the embedded metal traces can then also require that vertical interconnects (e.g., metal balls) used to connect these embedded metal traces in the ETS metallization layer to metal interconnects of another opposing package substrate in a second, vertical direction orthogonal to the first direction be reduced in size as well (e.g., to avoid shorts between adjacent vertical interconnects). Thus, these reduced size vertical interconnects can result in vertical connection gaps between the ETS and an opposing package substrate. Thus, to avoid these vertical connections gaps, in exemplary aspects, the T-shaped interconnects also each include an additional metal contact pad that is coupled to or disposed on a respective embedded metal trace to increase the height of the embedded metal trace, thus allowing smaller sized vertical interconnects to connect the T-shaped interconnects to metal interconnects in an opposing package substrate. In further exemplary aspects, the T-shape interconnects get their T-shape by the embedded metal traces being reduced in width in a horizontal direction(s) as compared to their respective additional coupled metal contact pads. This is so that the additional metal contact pads still have a sufficient landing area to support connections to the vertical interconnects, but the reduced-width embedded metal traces allow more space between adjacent embedded metal traces in the ETS metallization layer. This provides additional space to form additional metal traces in the ETS metallization layer between adjacent embedded metal traces of the T-shaped interconnects to provide additional signal routing capacity in the ETS metallization layer even with reduced pitch I/O connections.

In this regard, FIG. 1 is a side view of an IC package 100 that includes an interposer substrate 102 coupled to a lower, first die package 104 that includes a die coupled to an ETS 106. The interposer substrate 102 is a package substrate that includes metallization layers 108 with metal interconnects 110 for providing signal routing. The ETS 106 is also a type of package substrate that includes metallization layers 112 (1)-112(3) that each include metal interconnects 114(1)-114 (3) (e.g., metal traces, metal lines) for providing signal routing to a first die 116(1) in the lower die package 104 coupled to the ETS 106. The metallization layers 112(1)-112(3) are in parallel to each other and adjacent to each other, and extend in a first, horizontal direction in the X- and/or Y-axis directions. The first die 116(1) is electrically coupled to the ETS 106 by its die interconnects 118 being coupled to the metal interconnects 114(1) in the first, upper metallization layer 112(1) of the ETS 106. The ETS 106 is configured to provide signal routing paths through the coupling of metal interconnects 114(1)-114(3) in its respective metallization layers 112(1)-112(3) between the first die 116(1) and external interconnects 120 (e.g., solder balls, ball grid array (BGA) interconnects), etc.) for the IC package 100. The IC package 100 in FIG. 1 is arranged such that there is also electrical coupling provided between the interposer substrate 102 and the ETS 106 so that, for example, signal routing can be provided between a second die (not shown) coupled to the interposer substrate 102 and the ETS 106 and/or the external interconnects 120 with the IC package being a POP IC package. In this regard, vertical interconnects 122 (e.g., metal posts, metal pillars, metal balls) are disposed in the lower, first die package 104 and surrounded by a mold 124 and coupled to metal interconnects 110 in the interposer substrate 102 and ETS 106 to provide an electrical connection between the interposer substrate 102 and the ETS 106.

With continuing reference to FIG. 1, and as discussed in more detail below, the first, upper metallization layer 112(1) of the ETS 106 in the IC package 100 is the first ETS metallization layer 112(1). The ETS metallization layer 112(1) is also referred to as the upper and/or first ETS metallization layer 112(1). The first ETS metallization layer 112(1) includes a first insulating layer 126(1) in which the metal interconnects 114(1), in the form of and referred to herein as first "embedded metal traces" 114(1), are embedded as part of a first metal layer 128(1). The first insulating layer 126(1) is a layer of dielectric material that insulates the first embedded metal traces 114(1). An ETS metallization layer like the first ETS metallization layer 112(1) in the ETS 106 can support providing a higher density of embedded metal traces with reduced line/spacing ratio (L/S) to support higher density I/O connections. By embedding the first embedded metal traces 114(1) within the first insulating layer 126(1) to provide the first ETS metallization layer 112(1), the first ETS metallization layer 112(1) may also be able to be fabricated of reduced height $H_1$ in a second, vertical direction (Z-axis direction), as opposed to example pre-impregnated (PPG) fiber laminate metallization layers. Thus, providing the ETS 106 that includes one or more ETS metallization layers may be important to support higher I/O density connections in the IC package 100 as well as to reduce the overall height $H_2$ of the IC package 100.

Note that the other second and third metallization layers 112(2), 112(3) of the ETS 106 can also be ETS metallization layers. For example, in the ETS 106 in FIG. 1, the second metallization layer 112(2) is also an ETS metallization layer in this example that includes a second insulating layer 126(2) wherein its metal interconnects 114(2) are embedded metal traces embedded in the second insulating layer 126(2) as part of a second metal layer 128(2). The second insulating layer 126(2) is adjacent to the first ETS metallization layer 112(1) and its first insulating layer 126(1) in the second, vertical direction (Z-axis direction).

With continuing reference to FIG. 1, to further increase the density of I/O interconnections in the IC package 100 and supported by the ETS 106, the pitch of the first embedded metal traces 114(1) in the first ETS metallization layer 112(1) adjacent to the first die 116(1) and vertical interconnects 122 could be reduced. The pitch of the other metal interconnects 114(2), 114(3) in the other metallization layers 112(2), 112(3) could also be reduced. But with respect to the first embedded metal traces 114(1) in the first ETS metallization layer 112(1), reducing the pitch of these first embedded metal traces 114(1) can then also require that the vertical interconnects 122 connected to these first embedded metal traces 114(1) be reduced in size as well, to avoid shorts between adjacent vertical interconnects 122. Thus, these reduced size vertical interconnects 122 would result in vertical connection gaps between the first ETS metallization layer 112(1) and the interposer substrate 102.

Thus, to avoid these vertical connections gaps, as shown in FIG. 1 and as discussed in more detail below starting at FIG. 2, certain first embedded metal traces 114(1) in the first ETS metallization layer 112(1) that are coupled to vertical interconnects 122 are provided as part of T-shaped interconnects 130 that also additionally include a respective additional metal contact pad 132 that is coupled to or disposed on a respective first embedded metal trace 114(1) to increase the height of the first embedded metal trace 114(1), thus allowing smaller sized vertical interconnects 122 to connect the T-shaped interconnects 130 to metal interconnects 110 in the metallization layer 108 of the opposing interposer substrate 102. In this example, the T-shaped interconnects 130 get their T-shape by the first embedded metal traces 114(1) being reduced in width in the first, horizontal direction(s) (X-axis direction) as compared than their respective additional coupled metal contact pads 132. This is so that the additional metal contact pads 132 still have a sufficient landing area to support connections to the vertical interconnects 122, but the reduced-width, first embedded metal traces 114(1) allow more space between adjacent first embedded metal traces 114(1) in the first, horizontal direction(s) (X-axis direction) in the first ETS metallization layer 112(1). This provides additional space to form additional metal traces in the first ETS metallization layer 112(1) in the first, horizontal direction(s) (X-axis direction) between adjacent first embedded metal traces 114(1) of the T-shaped interconnects 130 to provide additional signal routing capacity in the first ETS metallization layer 112(1), even with reduced pitch I/O connections.

Figure 2:
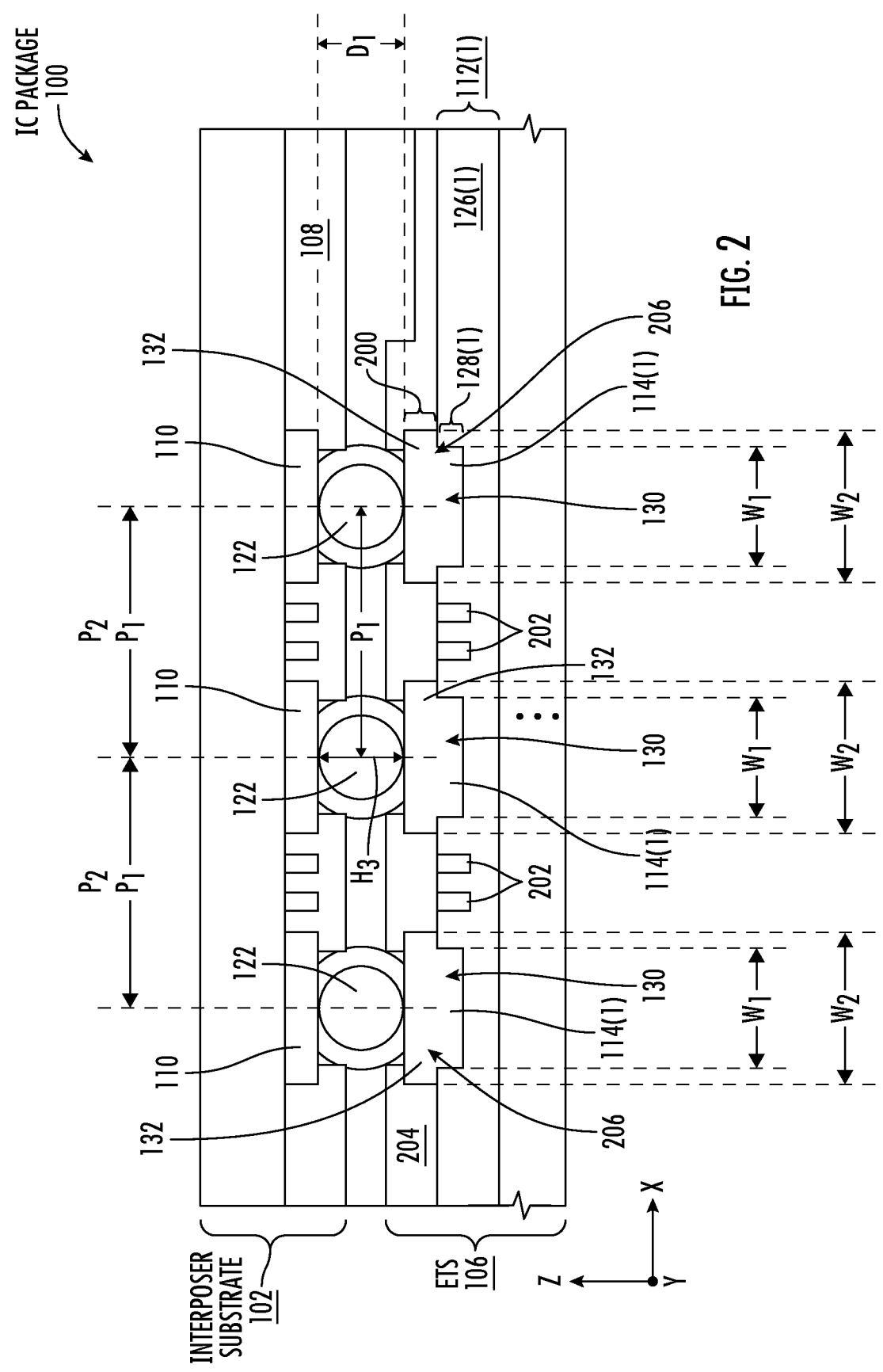
FIG. 2 is a close-up side view of the interposer substrate coupled through vertical interconnects to the T-shaped interconnects in the outer ETS metallization layer of the ETS in FIG. 1.

FIG. 2 is a close-up side view of the IC package 100 in FIG. 1 and its interposer substrate 102 coupled through the vertical interconnects 122 to the T-shaped interconnects 130 of the ETS 106 to discuss additional exemplary detail. As shown in FIG. 2, the first embedded metal traces 114(1) in the first ETS metallization layer 112(1) each have a first width $W_1$ in the first, horizontal direction (X-axis direction), which may have been reduced in the design to reduce pitch and increase the I/O connection density capability of the ETS 106. The additional metal contact pads 132 are disposed in a second metal layer 200 that is adjacent to the first metal layer 128(1) in the first ETS metallization layer 112(1). The inclusion of the additional metal contact pads 132 decreases the gap distance $D_1$ between the interposer substrate 102 and the ETS 106 in which the reduced height $H_3$ vertical interconnects 122 must span to provide an electrical connection between them. The additional metal contact pads 132 are provided of a second width $W_2$ in the first, horizontal direction (X-axis direction) to provide a sufficient landing are for the vertical interconnects 122 to make a sufficient connection of reduced or acceptable resistance. However, to provide additional room between the adjacent first embedded metal traces 114(1) in the first ETS metallization layer 112(1) to provide additional second metal interconnects 2020, which in this example are second embedded metal traces 202 embedded in the first insulating layer 126(1) adjacent to the first embedded metal traces 114(1) in the first direction. The second embedded metal traces 202 provide additional signal routing in the first ETS metallization layer 112(1). The first embedded metal traces 114(1) are provided of the first width $W_1$ than is less than the second width $W_2$ of the additional metal contact pads 132. This provides for the combined additional metal contact pads 132 coupled to respective first embedded metal traces 114(1) to have a T-shape, thus forming T-shaped interconnects 130 for the ETS 106. The reduced first width $W_1$ of the first embedded metal traces 114(1) provides additional lateral area in the horizontal directions (X- and/or Y-axis directions) to form the additional second embedded metal traces 202 in the first ETS metallization layer 112(1). The additional second embedded metal traces 202 that are disposed between adjacent first embedded metal traces 114(1) extend in a third direction (Y-axis direction), orthogonal to the first direction in this example, to provide additional signal routing in the ETS 106.

As shown in FIG. 2, the first embedded metal traces 114(1) are spaced apart to have a first pitch $P_1$. The additional metal contact pads are spaced apart to have a second pitch $P_2$, which is the same pitch in this example as the first pitch $P_1$. The first pitch $P_1$ and second pitch $P_2$ may be two hundred (200) micrometers (μm), as a non-limiting example. The first width $W_1$ of the first embedded metal traces 114(1) may be between 90 μm and 125 μm as a non-limiting example. The first width $W_1$ of the first embedded metal traces 114(1) may be less than 90 μm. The second width $W_2$ of the additional metal contact pads 132 may be between 110 μm and 145 μm, as a non-limiting example. The second width $W_2$ of the additional metal contact pads 132 may be less than 110 μm. A ratio of the second width $W_2$ of the additional metal contact pads 132 to the first width $W_1$ of the first embedded metal traces 114(1) may be greater than or equal to 20 μm, as another non-limiting example.

With continuing reference to FIG. 2, the additional metal contact pads 132 are formed in the second metal layer 200 that is covered in an insulating layer 204. The insulating layer 204 may be a solder resist layer that is processed during fabrication to pattern a plurality of openings 206 adjacent to the additional metal contact pads 132 to expose them from the insulating layer 204 to allow the vertical interconnects 122 to be coupled to the additional metal contact pads 132.

Note that T-shaped interconnects that are comprised of wider additional metal contact pads coupled to less wide metal interconnects, such as embedded metal traces, can also be included in the interposer substrate 102 to also facilitate supporting increased I/O connection density like described above for the first ETS metallization layer 112(1) in the ETS 106. As shown in FIG. 2, the interposer substrate 102 does not include the additional metal contact pads that are wider than metal interconnect, but just the metal interconnects 110 as part of the metallization layer 108 in the interposer substrate 102. The additional metal contact pads may not be necessary to include in the metallization layer 108 of the interposer substrate 102, because the gap distance $D_1$ may be able to be eliminated solely with the additional of the additional metal contact pads 132 in the ETS 106.

Figure 3:
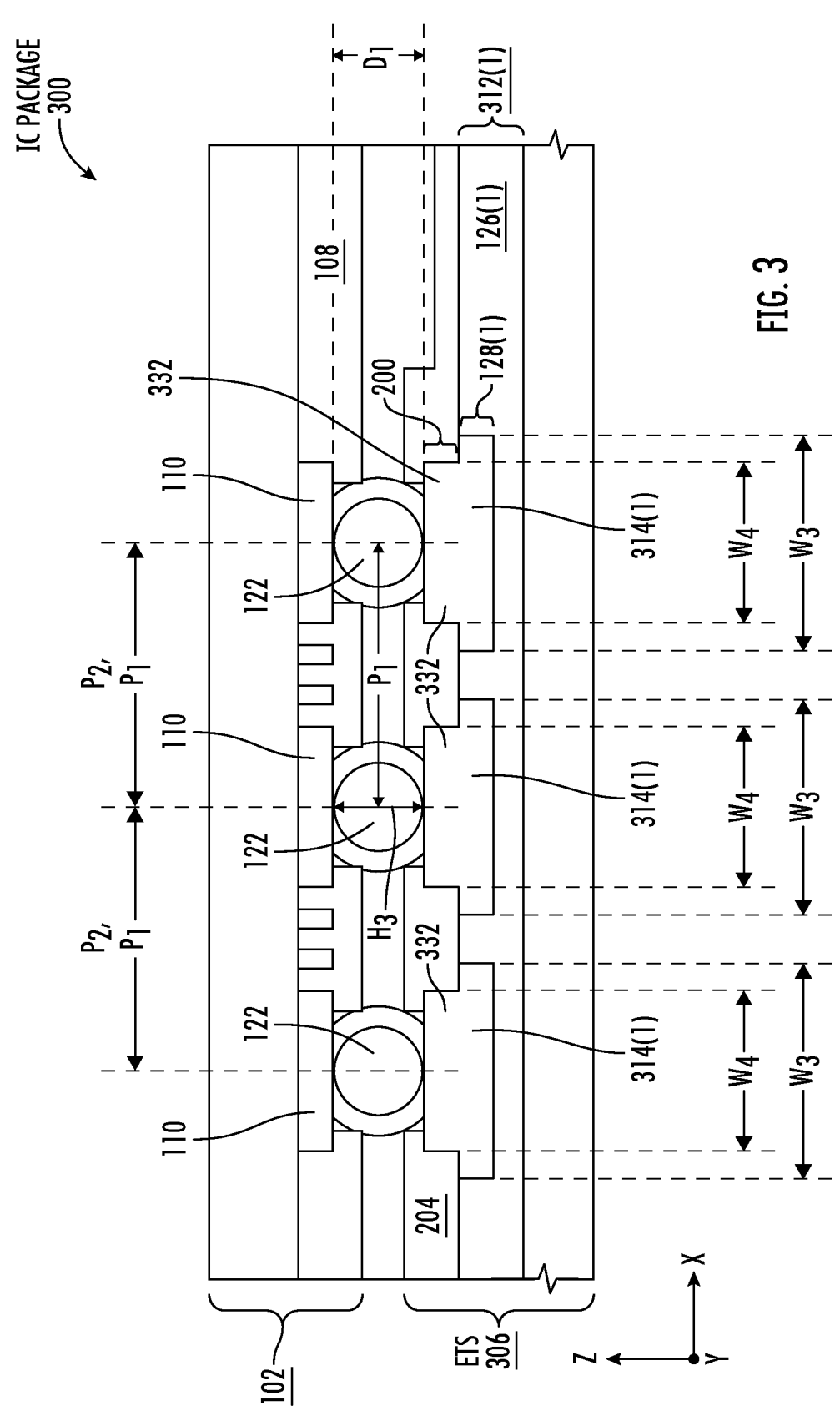
FIG. 3 is a close-up side view of the interposer substrate coupled through vertical interconnects to the interconnects in an outer ETS metallization layer of the ETS, wherein such interconnects have larger width embedded metal traces that do not include additional room for including addition embedded metal traces between adjacent embedded metal traces for additional signal routing capacity in the ETS.

For comparison purposes, FIG. 3 is a close-up side view of an alternative IC package 300 that is similar to the IC package 100 in FIGS. 1 and 2. However, an ETS 306 of the IC package 300, and its first ETS metallization layer 312(1), does not include the T-shaped interconnects that include embedded metal traces, like first embedded metal traces 114(1), of reduced width from additional metal contact pads, but rather embedded metal traces 314(1) that have an increased width $W_3$ over the width $W_4$ of coupled additional metal pads 332. Common elements between the IC package 300 in FIG. 3 and the IC package 100 in FIGS. 1 and 2 are shown with common element numbers. As shown in FIG. 3, because the embedded metal traces 314(1) that have an increased width $W_3$ over the width $W_4$ of coupled additional metal pads 332 and over the width $W_1$ of the first embedded metal traces 114(1) in the IC package 100 in FIG. 2, there is not sufficient room between adjacent embedded metal traces 314(1) to provide additional metal interconnects between the first ETS metallization layer 312(1) for additional routing capacity in the ETS 306 of the IC package 300, like the additional embedded metal traces 202 in the IC package 100 in FIG. 2.

An ETS that includes an outer ETS metallization layer that includes T-shape interconnects with reduced width embedded metal traces, each coupled to a larger width additional metal contact pad coupled to vertical interconnects coupled to the opposite interposer substrate, including but not limited to the ETS 106 in FIGS. 1 and 2, can be fabricated in different fabrication processes. In this regard, FIG. 4 is a flowchart illustrating an exemplary fabrication process 400 of fabricating an ETS that includes an outer ETS metallization layer that includes T-shape interconnects with reduced width embedded metal traces each coupled to a larger width additional metal contact pad coupled to vertical interconnects coupled to the opposite interposer substrate, including but not limited to the ETS 106 in FIGS. 1 and 2 as an example. The fabrication process 400 in FIG. 4 will be discussed in conjunction with the ETS 106 and its IC package 100 in FIGS. 1 and 2, as an example.

In this regard, a first step in the fabrication process 400 in FIG. 4 can include forming a first ETS metallization layer 112(1) extending in a first direction (X-axis direction) (block 402 in FIG. 4). Forming the first ETS metallization layer 112(1) can include forming a first insulating layer 126(1) (block 404 in FIG. 4), and embedding a plurality of first embedded metal traces 114(1) embedded in the first insulating layer 126(1), the plurality of first embedded metal traces 114(1) each having a first width $W_1$ in the first direction (X-axis direction) (block 406 in FIG. 6). A next step in the fabrication process 400 can include forming a second metal layer 200 adjacent to the first metal layer 128(1), the second metal layer 200 comprising a plurality of metal contact pads 132, each having a second width $W_2$ greater than the first width $W_1$ in the first direction (X-axis direction) (block 408 in FIG. 4). A next step in the fabrication process 400 can include coupling each metal contact pad 132 of the plurality of metal contact pads 132 to a first embedded metal trace 114(1) of the plurality of first embedded metal traces 114(1) (block 410 in FIG. 4).

Figures 5A, 6A, 6B:
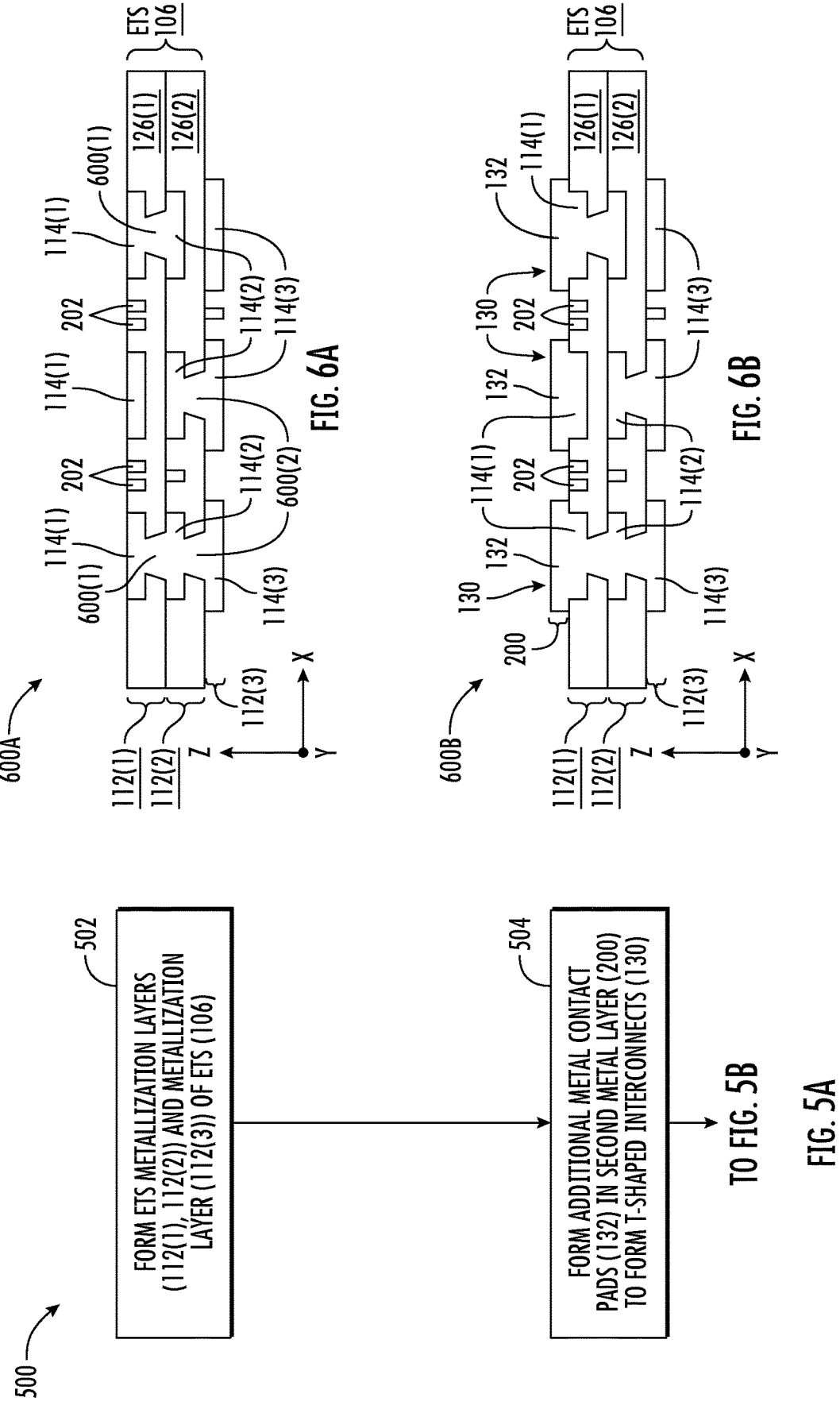
FIGS. 5A-5C is a flowchart illustrating another exemplary fabrication process of fabricating a ETS that includes an outer ETS metallization layer that includes T-shape interconnects with reduced width embedded metal traces each coupled to a larger width additional metal contact pad coupled to vertical interconnects coupled to the opposite interposer substrate, including but not limited to the ETSs in FIGS. 1 and 2.
FIGS. 6A-6E are exemplary fabrication stages during fabrication of the ETS according to the fabrication process in FIGS. 5A-5C.
Figures 5B, 6C, 6D:
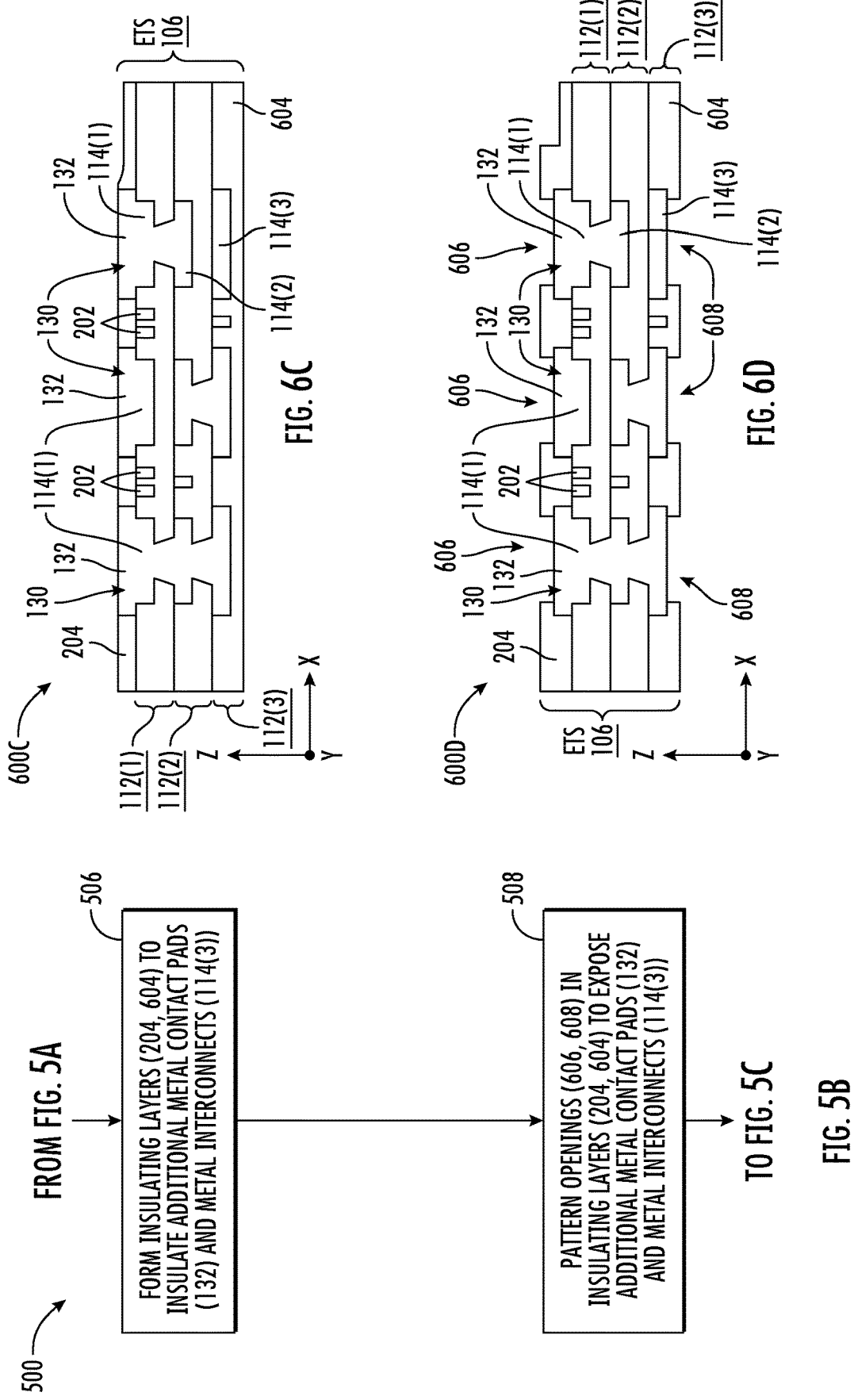
Figures 5C, 6E:
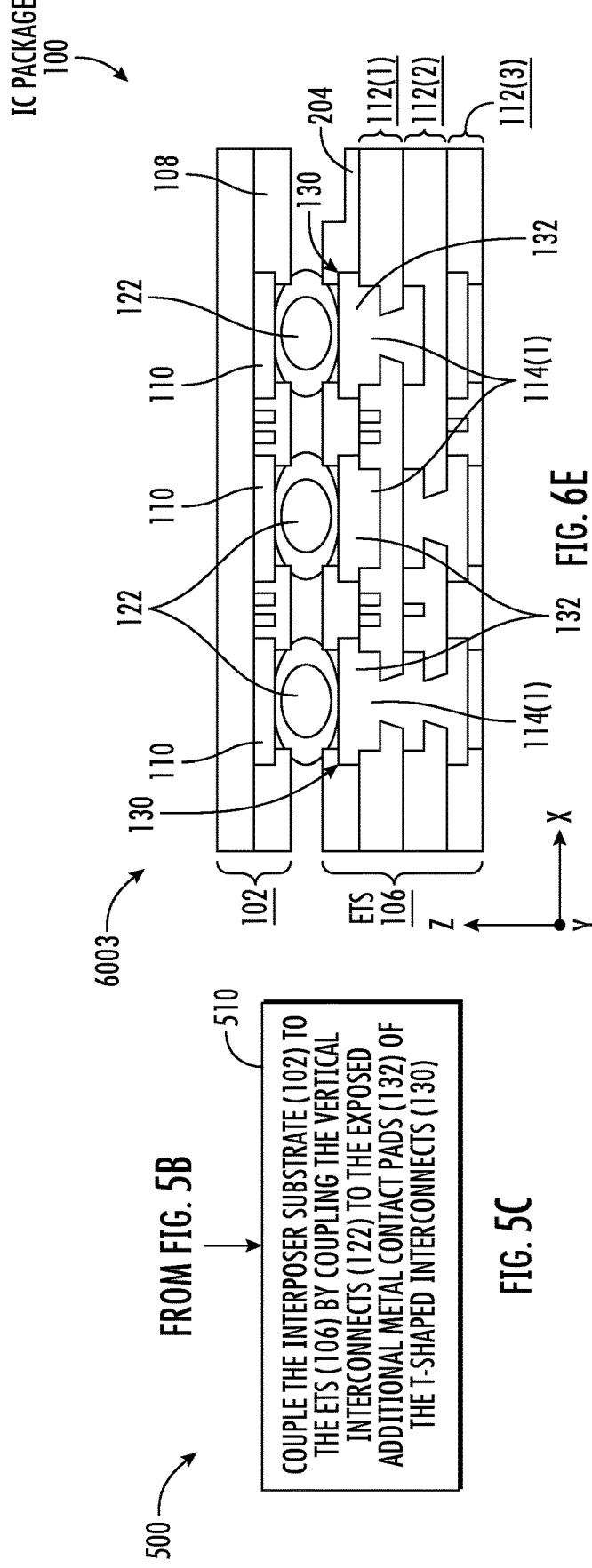

Other fabrication processes can also be employed to fabricate an ETS that includes an outer ETS metallization layer that includes T-shape interconnects with reduced width embedded metal traces each coupled to a larger width additional metal contact pad coupled to vertical interconnects coupled to the opposite interposer substrate, including but not limited to the ETS 106 and related IC package 100 in FIGS. 1 and 2. In this regard, FIGS. 5A-5C is a flowchart illustrating another exemplary fabrication process 500 of fabricating an ETS that includes an outer ETS metallization layer that includes T-shape interconnects with reduced width embedded metal traces each coupled to a larger width additional metal contact pad coupled to vertical interconnects coupled to the opposite interposer substrate, including but not limited to the ETS 106 and related IC package 100 in FIGS. 1 and 2. FIGS. 6A-6E are exemplary fabrication stages 600A-600E during fabrication of an ETS according to the fabrication process 500 in FIGS. 5A-5C. The fabrication process 500 as shown in the fabrication stages 600A-600E in FIGS. 6A-6E are in reference to the ETS 106 and related IC package 100 in FIGS. 1 and 2, and thus will be discussed with reference to the ETS 106 and IC package 100 in FIG. 1.

In this regard, as shown the fabrication stage 600A in FIG. 6A, a first exemplary step in the fabrication process 600 is to form first and second ETS metallization layers 112(1), 112(2) with the first and second embedded metal traces 114(1), 114(2) embedded in the respective first and second insulating layers 126(1), 126(2) (block 502 in FIG. 5A). A third metallization layer 112(3) is also formed, to provide metal interconnects 114(3) that will serve to be coupled to the external interconnects 120. The additional second embedded metal traces 202 are formed in the first ETS metallization layer 112(1) made available by the reduced-width, first embedded metal traces 114(1) in the first ETS metallization layer 112(1) as previously discussed above. Then, as shown the fabrication stage 600B in FIG. 6B, a next exemplary step in the fabrication process 600 can be to form the additional metal contact pads 132 on and coupled to the first embedded metal traces 114(1) of the first ETS metallization layer 112(1) to form the T-shaped interconnects 130 for being coupled to vertical interconnects 122 (as shown in FIGS. 1 and 2) (block 504 in FIG. 5A). For example, the additional metal contact pads 132 may be formed through a metal plating process in which a metal layer as part of a second metal layer 200 is disposed on the first embedded metal traces 114(1) and its first insulating layer 126(1), and then pattered with portions of the metal layer removed to leave the additional metal contact pads 132 remaining in the desired locations and of the desired width, which as discussed above is wider than the width of the first embedded metal traces 114(1).

Then, as shown the fabrication stage 600C in FIG. 6C, a next exemplary step in the fabrication process 600 can be to form insulating layers 204, 604 on the additional metal contact pads 132 and the metal interconnects 114(3) in the third metallization layer 112(3) to insulate the additional metal contact pads 132 and the metal interconnects 114(3) (block 506 in FIG. 5B). The insulating layers 204, 604 may be solder resist layers. Then, as shown the fabrication stage 600D in FIG. 6D, a next exemplary step in the fabrication process 600 can be to pattern openings 606, 608 in the respective insulating layers 204, 604 adjacent to the respective additional metal contact pads 132 and the metal interconnects 114(3) to expose the additional metal contact pads 132 and the metal interconnects 114(3) to allow for external interconnects to be formed in contact with same for electrical connections to the ETS 106 (block 508 in FIG. 5B).

Then, as shown the fabrication stage 600E in FIG. 6E, a next exemplary step in the fabrication process 600 can be to couple the vertical interconnects 122 to the exposed additional metal contact pads 132 to couple the interposer substrate 102 to the ETS 106 (block 510 in FIG. 5C). The vertical interconnects 122 may be coupled to the exposed additional metal contact pads 132 before the interposer substrate 102 is placed and its metal interconnects 110 in the metallization layer 108 are coupled to the vertical interconnects 122. The first die 116(1) is coupled to the ETS 106 as shown in FIG. 1, before the interposer substrate 102 is placed and coupled to the vertical interconnects 122.

An ETS that includes an outer ETS metallization layer that includes T-shape interconnects with reduced width embedded metal traces each coupled to a larger width additional metal contact pad coupled to vertical interconnects coupled to the opposite interposer substrate, including but not limited to the ETS 106 and related IC package 100 in FIGS. 1, 2, and 6A-6E, and according to the exemplary fabrication processes in FIGS. 4 and 5A-5C, and according to any aspects disclosed herein, may be provided in an IC package provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 7:
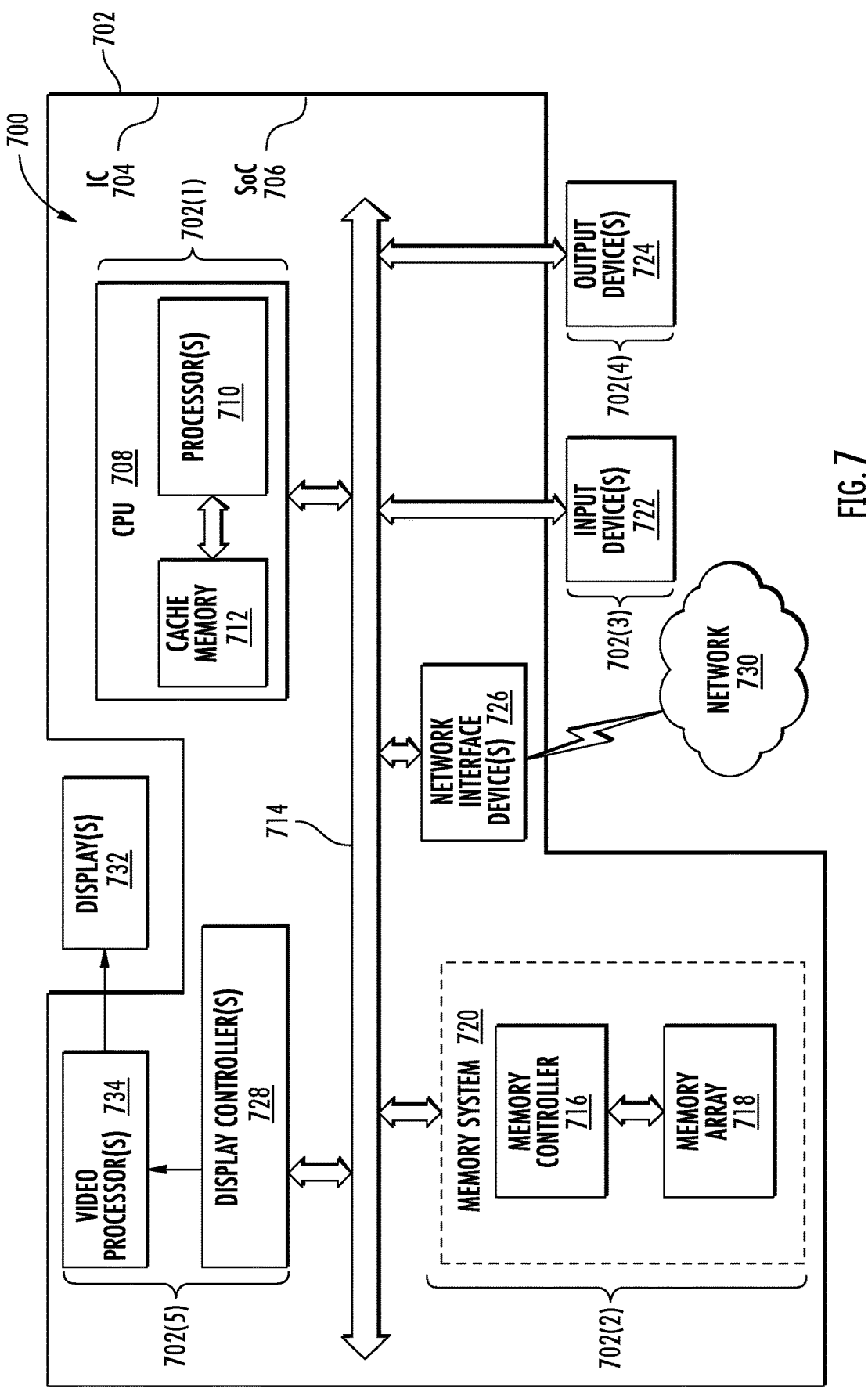
FIG. 7 is a block diagram of an exemplary processor-based system that can include components that can include an IC package that includes an ETS that includes an outer ETS metallization layer that includes T-shape interconnects with reduced width embedded metal traces each coupled to a larger width additional metal contact pad coupled to vertical interconnects coupled to the opposite interposer substrate, including but not limited to the ETSs in FIGS. 1, 2, and 6A-6E, and according to the exemplary fabrication processes in FIGS. 4-5C.

In this regard, FIG. 7 illustrates an example of a processor-based system 700 that includes a circuits that can be provided in IC packages 702, 702(1)-702(5). Any of the IC packages 702, 702(1)-702(5) can include an ETS that includes an outer ETS metallization layer that includes T-shape interconnects with reduced width embedded metal traces, each coupled to a larger width additional metal contact pad coupled to vertical interconnects coupled to the opposite interposer substrate, including but not limited to the ETS 106 in FIGS. 1, 2, and 6A-6E and a related IC package 100 in FIGS. 1 and 6E, and according to the exemplary fabrication processes in FIGS. 4 and 5A-5C, and according to any aspects disclosed herein. In this example, the processor-based system 700 may be formed as an IC 704 in an IC package 702 and as a system-on-a-chip (SoC) 706. The processor-based system 700 includes a central processing unit (CPU) 708 that includes one or more processors 710, which may also be referred to as CPU cores or processor cores. The CPU 708 may have cache memory 712 coupled to the CPU 708 for rapid access to temporarily stored data. The CPU 708 is coupled to a system bus 714 and can intercouple master and slave devices included in the processor-based system 700. As is well known, the CPU 708 communicates with these other devices by exchanging address, control, and data information over the system bus 714. For example, the CPU 708 can communicate bus transaction requests to a memory controller 716, as an example of a slave device. Although not illustrated in FIG. 7, multiple system buses 714 could be provided, wherein each system bus 714 constitutes a different fabric.

Other master and slave devices can be connected to the system bus 714. As illustrated in FIG. 7, these devices can include a memory system 720 that can be in a separate IC package 702(2) and that includes the memory controller 716 and a memory array(s) 718, one or more input devices 722 (that can be in a separate IC package 702(3)), one or more output devices 724 (that can be in a separate IC package 702(4)), one or more network interface devices 726, and one or more display controllers 728, as examples. Each of the memory system 720, the one or more input devices 722, the one or more output devices 724, the one or more network interface devices 726, and the one or more display controllers 728 can be provided in the same or different IC packages 702(5). The input device(s) 722 can include any type of input device, including, but not limited to, input keys, switches, voice processors, etc. The output device(s) 724 can include any type of output device, including, but not limited to, audio, video, other visual indicators, etc. The network interface device(s) 726 can be any device configured to allow exchange of data to and from a network 730. The network 730 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 726 can be configured to support any type of communications protocol desired.

The CPU 708 may also be configured to access the display controller(s) 728 over the system bus 714 to control information sent to one or more displays 732. The display controller(s) 728 sends information to the display(s) 732 to be displayed via one or more video processors 734, which process the information to be displayed into a format suitable for the display(s) 732. The display controller(s) 728 and video processor(s) 734 can be included as ICs in the same or different IC packages 702(5), and in the same or different IC package 702(1) containing the CPU 708, as an example. The display(s) 732 can include any type of display, including, but not limited to, a cathode ray tube (CRT), a liquid crystal display (LCD), a plasma display, a light emitting diode (LED) display, etc.

Figure 8:
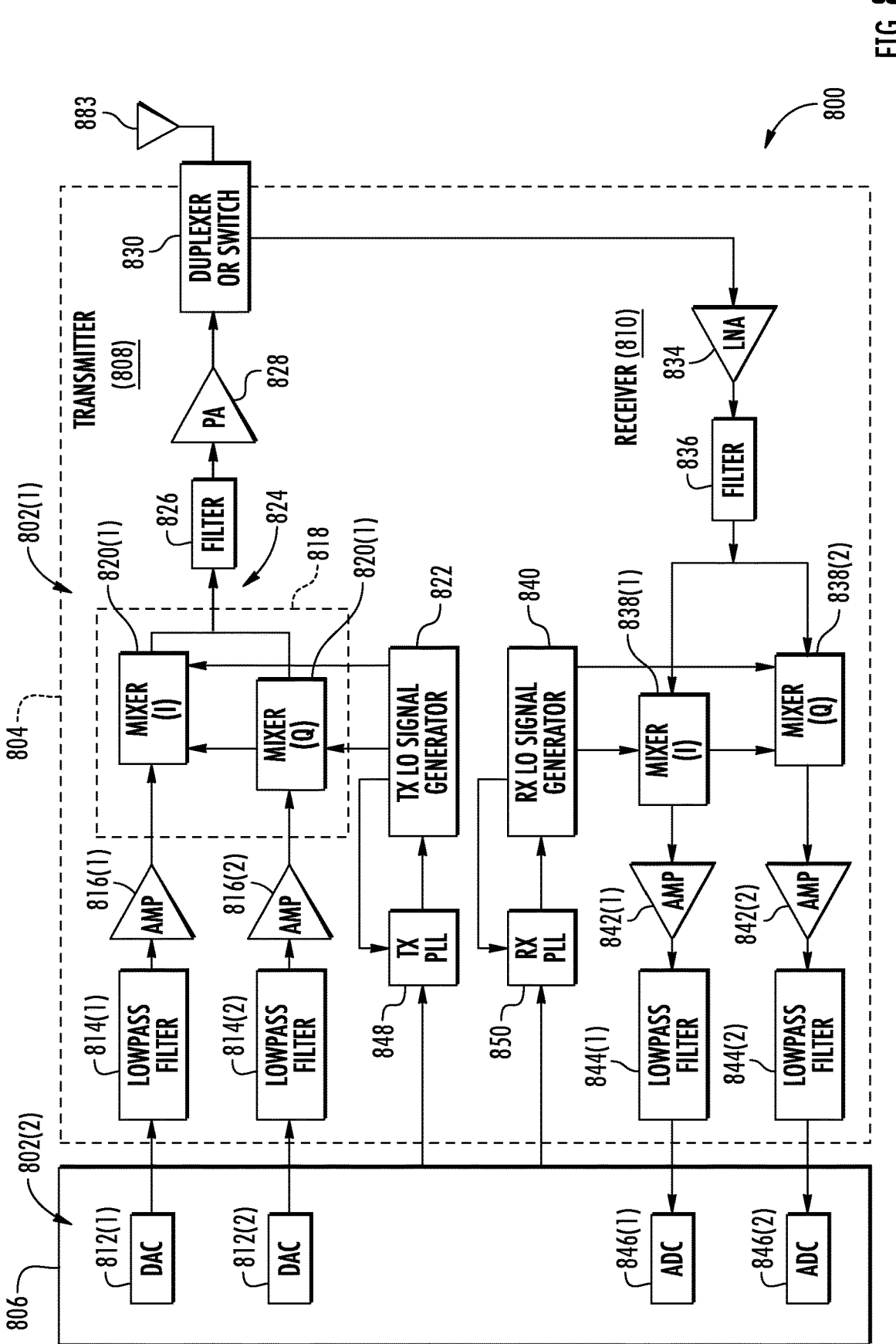
FIG. 8 is a block diagram of an exemplary wireless communications device that includes radio-frequency (RF) components that can include IC package that includes an ETS that includes an outer ETS metallization layer that includes T-shape interconnects with reduced width embedded metal traces each coupled to a larger width additional metal contact pad coupled to vertical interconnects coupled to the opposite interposer substrate, including but not limited to the ETSs in FIGS. 1, 2, and 6A-6E, and according to the exemplary fabrication processes in FIGS. 4-5C.

FIG. 8 illustrates an exemplary wireless communications device 800 that includes radio frequency (RF) components formed from one or more IC packages 802(1), 802(2), wherein any of the IC packages 802(1), 802(2) can include an ETS that includes an outer ETS metallization layer that includes T-shape interconnects with reduced width embedded metal traces, each coupled to a larger width additional metal contact pad coupled to vertical interconnects coupled to the opposite interposer substrate, including but not limited to the ETS 106 in FIGS. 1, 2, and 6A-6E and a related IC package 100 in FIGS. 1 and 6E, and according to the exemplary fabrication processes in FIGS. 4 and 5A-5C, and according to any aspects disclosed herein. The wireless communications device 800 may include or be provided in any of the above-referenced devices, as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RF ICs (RFICs), mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 810. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (DACs) 812(1), 812(2) for converting digital signals generated by the data processor 806 into the I and Q analog output signals, e.g., I and Q output currents, for further processing.

Within the transmitter 808, lowpass filters 814(1), 814(2) filter the I and Q analog output signals, respectively, to remove undesired signals caused by the prior digital-to-analog conversion. Amplifiers (AMPs) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals through mixers 820(1), 820(2) from a TX LO signal generator 822 to provide an upconverted signal 824. A filter 826 filters the upconverted signal 824 to remove undesired signals caused by the frequency up-conversion as well as noise in a receive frequency band. A power amplifier (PA) 828 amplifies the upconverted signal 824 from the filter 826 to obtain the desired output power level and provides a transmit RF signal. The transmit RF signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Down-conversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by AMPs 842(1), 842(2) and further filtered by lowpass filters 844(1), 844(2) to obtain I and Q analog input signals, which are provided to the data processor 806. In this example, the data processor 806 includes analog-to-digital converters (ADCs) 846(1), 846(2) for converting the analog input signals into digital signals to be further processed by the data processor 806.

In the wireless communications device 800 of FIG. 8, the TX LO signal generator 822 generates the I and Q TX LO signals used for frequency up-conversion, while the RX LO signal generator 840 generates the I and Q RX LO signals used for frequency down-conversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An embedded trace substrate (ETS), comprising:
   a first ETS metallization layer extending in a first direction, the first ETS metallization layer comprising:
   a first insulating layer; and
   a first metal layer comprising:
   a plurality of first embedded metal traces embedded in the first insulating layer, the plurality of first embedded metal traces each having a first width in the first direction; and
   a second metal layer adjacent to the first metal layer, the second metal layer comprising a plurality of metal contact pads each having a second width greater than the first width in the first direction, each metal contact pad of the plurality of metal contact pads coupled to a first embedded metal trace of the plurality of first embedded metal traces.

2. The ETS of clause 1, wherein the first metal layer further comprises a plurality of second embedded metal traces embedded in the first insulating layer;

the plurality of second embedded metal traces are each disposed between adjacent first embedded metal traces of the plurality of first embedded metal traces in the first direction.

3. The ETS of clause 2 or 3, wherein the plurality of first embedded metal traces have a first pitch and the plurality of metal contact pads have the first pitch.

4. The ETS of clause 3, wherein the first pitch is less than or equal to two hundred (200) micrometers (μm).

5. The ETS of any of clauses 1-4, wherein:

the first width is between 90 and 125 micrometers (μm); and the second width is between 110 and 145 μm.

6. The ETS of any of clauses 1-5, wherein a ratio of the second width to the first width is greater than or equal to 20 micrometers (μm).

7. The ETS of clause 2, wherein:

the plurality of first embedded metal traces extend in the first direction; and the plurality of second embedded metal traces extend in a second direction orthogonal to the first direction.

8. The ETS of any of clauses 1-7, further comprising a second metallization layer parallel to the first ETS metallization layer in the first direction such that the first ETS metallization layer is disposed between the second metallization layer and the second metal layer in a second direction orthogonal to the first direction;

the second metallization layer comprising a plurality of second metal interconnects each coupled to a first embedded metal trace of the plurality of first embedded metal traces.

9. The ETS of clause 8, wherein the second metallization layer comprises a second ETS metallization layer comprising:

a third insulating layer; and a third metal layer comprising the plurality of second metal interconnects comprising a plurality of third embedded metal traces embedded in the third insulating layer.

10. The ETS of any of clauses 1-9, further comprising a second insulating layer adjacent to the first ETS metallization layer, the second insulating layer comprising the second metal layer.

11. The ETS of clause 10, further comprising a solder resist layer comprising the second insulating layer.

12. The ETS of clause 10 or 11, wherein the second insulating layer comprises a plurality of first openings each adjacent to a metal contact pad of the plurality of metal contact pads.

13. A method of fabricating an embedded trace substrate (ETS), comprising:

forming a first ETS metallization layer extending in a first direction, comprising:

forming a first insulating layer; and embedding a plurality of first embedded metal traces in a first metal layer in the first insulating layer, the plurality of first embedded metal traces each having a first width in the first direction;

forming a second metal layer adjacent to the first metal layer, the second metal layer comprising a plurality of metal contact pads each having a second width greater than the first width in the first direction; and coupling each metal contact pad of the plurality of metal contact pads to a first embedded metal trace of the plurality of first embedded metal traces.

14. The method of clause 13, further comprising embedding a plurality of second embedded metal traces embedded in the first insulating layer each disposed between adjacent first embedded metal traces of the plurality of first embedded metal traces in the first direction.

15. The method of clause 13 or 14, wherein forming the second metal layer further comprises metal plating the plurality of metal contact pads each in contact with a first embedded metal trace of the plurality of first embedded metal traces.

16. The method of clause 13 or 14, further comprising forming a first solder resist layer on the plurality of metal contact pads such that the first solder resist layer is adjacent to the first metal layer.

17. The method of clause 16, further comprising:

forming a second solder resist layer on the first solder resist layer and the plurality of metal contact pads; and patterning a plurality of openings in the second solder resist layer each adjacent to a metal contact pad of the plurality of metal contact pads in the second metal layer.

18. The method of clause 14, wherein:

embedding the plurality of first embedded metal traces comprises embedding the plurality of first embedded metal traces in the first insulating layer to extend in the first direction; and embedding the plurality of second embedded metal traces comprises embedding the plurality of second embedded metal traces in the first insulating layer to extend in a second direction orthogonal to the first direction.

19. An IC package, comprising:

a first die package, comprising:

an embedded trace substrate (ETS) comprising a first ETS metallization layer extending in a first direction; and a first die coupled to the first ETS metallization layer;

the first ETS metallization layer, comprising:

a first insulating layer; and a first metal layer comprising:

a plurality of first embedded metal traces embedded in the first insulating layer, the plurality of first embedded metal traces each having a first width in the first direction; and the ETS further comprising a second metal layer adjacent to the first metal layer, the second metal layer comprising a plurality of metal contact pads each having a second width greater than the first width in the first direction, each metal contact pad of the plurality of metal contact pads coupled to a first embedded metal trace of the plurality of first embedded metal traces;

an interposer substrate comprising a plurality of first metal interconnects; and a plurality of vertical interconnects extending in a second direction orthogonal to the first direction, each vertical interconnect of the plurality of vertical interconnects coupled to a metal contact pad of the plurality of metal contact pads and a first metal interconnect of the plurality of first metal interconnects.

20. The IC package of clause 19, wherein the first metal layer further comprises a plurality of second embedded metal traces embedded in the first insulating layer;

the plurality of second embedded metal traces are each disposed between adjacent first embedded metal traces of the plurality of first embedded metal traces in the first direction.

What is claimed is:

1. A method of fabricating an IC package, comprising:
forming a first die package, comprising:
forming an embedded trace substrate (ETS) comprising:
forming an ETS metallization layer extending in a first direction, comprising:
forming a first insulating layer; and
embedding a plurality of first embedded metal traces in a first metal layer in the first insulating layer, the plurality of first embedded metal traces each having a first width in the first direction;
embedding a plurality of second embedded metal traces embedded in the first insulating layer; and
forming a solder resist layer comprising second metal layer comprising a plurality of metal contact pads each having a second width greater than the first width of the plurality of first embedded metal traces in the first direction;
coupling each metal contact pad of the plurality of metal contact pads to a first embedded metal trace of the plurality of first embedded metal traces;
coupling a die to the ETS comprising coupling each die interconnect of plurality of die interconnects of the die directly to a second embedded metal trace of the plurality of second embedded metal traces in the ETS metallization layer;
providing interposer substrate comprising a first metallization layer comprising a plurality of first metal interconnects; and
coupling a plurality of vertical interconnects to a metal contact pad of the plurality of metal contact pads in the solder resist layer of the ETS and a first metal interconnect of the plurality of first metal interconnects in the interposer substrate.

2. The method of claim 1, wherein forming the ETS metallization layer further comprises embedding a plurality of second embedded metal traces embedded in the first insulating layer each disposed between adjacent first embedded metal traces of the plurality of first embedded metal traces in the first direction.

3. The method of claim 1, wherein forming the solder resist layer further comprises metal plating the plurality of metal contact pads each in contact with a first embedded metal trace of the plurality of first embedded metal traces.

4. The method of claim 1, wherein forming the ETS further comprises:
forming a second solder resist layer on the first solder resist layer and the plurality of metal contact pads; and
patterning a plurality of openings in the second solder resist layer each adjacent to a metal contact pad of the plurality of metal contact pads in the second metal layer.

5. The method of claim 2, wherein:
embedding the plurality of first embedded metal traces comprises embedding the plurality of first embedded metal traces in the first insulating layer to extend in the first direction; and embedding the plurality of second embedded metal traces comprises embedding the plurality of second embedded metal traces in the first insulating layer to extend in a second direction orthogonal to the first direction.

6. The method of claim 1, wherein the plurality of first embedded metal traces have a first pitch and the plurality of metal contact pads have the first pitch.

7. The method of claim 1, wherein forming the solder resist layer further comprises:
forming a plurality of first openings in solder resist layer; and
exposing each metal contact pad of the plurality of metal contact pads from a first opening of the plurality of openings in the solder resist layer.

8. The method of claim 1, further comprising not coupling the plurality of die interconnects to the plurality of metal contact pads.

9. An IC package, comprising:
a first die package, comprising:
an embedded trace substrate (ETS) comprising:
an ETS metallization layer extending in a first direction,
a first die coupled to the ETS metallization layer;
the ETS metallization layer, comprising:
a first insulating layer; and
a first metal layer comprising:
a plurality of first embedded metal traces embedded in the first insulating layer, the plurality of first embedded metal traces each having a first width in the first direction; and
a plurality of second embedded metal traces embedded in the first insulating layer; and
the ETS further comprising a solder resist layer comprising a second metal layer comprising:
a plurality of metal contact pads each having a second width greater than the first width of the plurality of first embedded metal traces in the first direction; and
each metal contact pad of the plurality of metal contact pads coupled to a first embedded metal trace of the plurality of first embedded metal traces;
the first die comprising a plurality of die interconnects each directly coupled to a second embedded metal trace of the plurality of second embedded metal traces in the ETS metallization layer;
an interposer substrate comprising a first metallization layer comprising a plurality of first metal interconnects; and
a plurality of vertical interconnects each coupled to a metal contact pad of the plurality of metal contact pads in the solder resist layer of the ETS and a first metal interconnect of the plurality of first metal interconnects in the interposer substrate.

10. The IC package of claim 9, wherein:
the first metal layer further comprises a plurality of third embedded metal traces embedded in the first insulating layer; and
the plurality of third embedded metal traces are each disposed between adjacent first embedded metal traces of the plurality of first embedded metal traces in the first direction.

11. The IC package of claim 10, wherein:
the plurality of first embedded metal traces extend in the first direction; and
the plurality of third embedded metal traces extend in a second direction orthogonal to the first direction.

12. The IC package of claim 9, wherein:

the solder resist layer comprises a plurality of first openings; and each metal contact pad of the plurality of metal contact pads is exposed from a first opening of the plurality of openings in the solder resist layer.

13. The IC package of claim 9, wherein the interposer substrate comprises a second solder resist layer comprising the first metallization layer.

14. The IC package of claim 9, wherein the plurality of first embedded metal traces have a first pitch and the plurality of metal contact pads have the first pitch.

15. The IC package of claim 14, wherein the first pitch is less than or equal to two hundred (200) micrometers (μm).

16. The IC package of claim 9, wherein:

the first width is between 90 and 125 micrometers (μm); and the second width is between 110 and 145 μm.

17. The IC package of claim 9, wherein a ratio of the second width to the first width is greater than or equal to 20 micrometers (μm).

18. The IC package of claim 9, wherein the ETS further comprises a second metallization layer parallel to the ETS metallization layer in the first direction such that the ETS metallization layer is disposed between the second metallization layer and the second metal layer in a second direction orthogonal to the first direction;

the second metallization layer comprising a plurality of second metal interconnects each coupled to a first embedded metal trace of the plurality of first embedded metal traces.

19. The IC package of claim 18, wherein the second metallization layer comprises a second ETS metallization layer comprising:

a third insulating layer; and a third metal layer comprising the plurality of second metal interconnects comprising a plurality of third embedded metal traces embedded in the third insulating layer.

20. The IC package of claim 9, wherein each of the plurality of die interconnects are not coupled to plurality of metal contact pads.

* * * * *